United States Patent [19]
Lee et al.

[11] Patent Number: 5,900,658
[45] Date of Patent: May 4, 1999

[54] LOGIC AND SINGLE LEVEL POLYSILICON DRAM DEVICES FABRICATED ON THE SAME SEMICONDUCTOR CHIP

[75] Inventors: Jin-Yuan Lee; Chue-San Yoo; Mong-Song Liang, all of Hsin-Chu, Taiwan

[73] Assignee: Taiwan Semiconductor Manufacturing Company, Ltd., Hsin-Chu, Taiwan

[21] Appl. No.: 08/950,233

[22] Filed: Oct. 14, 1997

Related U.S. Application Data

[62] Division of application No. 08/660,306, Jun. 7, 1996, Pat. No. 5,712,201.

[51] Int. Cl.⁶ .................................................. H01L 7/01
[52] U.S. Cl. .................................................... 257/296
[58] Field of Search .............................. 257/296, 298, 257/903, 904, 905, 908

[56] References Cited

U.S. PATENT DOCUMENTS

| | | | |
|---|---|---|---|
| 5,066,602 | 11/1991 | Takemoto et al. | 438/203 |
| 5,134,085 | 7/1992 | Gilgen et al. | 438/210 |
| 5,340,762 | 8/1994 | Vora | 438/207 |
| 5,442,210 | 8/1995 | Kanehachi | 257/296 |
| 5,550,078 | 8/1996 | Sung | 438/210 |
| 5,659,191 | 8/1997 | Arima | 257/296 |
| 5,796,135 | 8/1998 | Liang et al. | 257/296 |

*Primary Examiner*—Jerome Jackson, Jr.
*Assistant Examiner*—George C. Eckert, II
*Attorney, Agent, or Firm*—George O. Saile; Stephen B. Ackerman

[57] ABSTRACT

A semiconductor fabrication process has been developed in which both DRAM and logic device structures are integrated on a single silicon chip. The process features combining process steps for both device types, while using only a single level of polysilicon for both a high capacity DRAM cell, as well as for a CMOS logic cell. The high capacity DRAM cell is composed of an overlying polysilicon storage gate structure, a thin dielectric layer, and an underlying doped semiconductor regions.

3 Claims, 9 Drawing Sheets

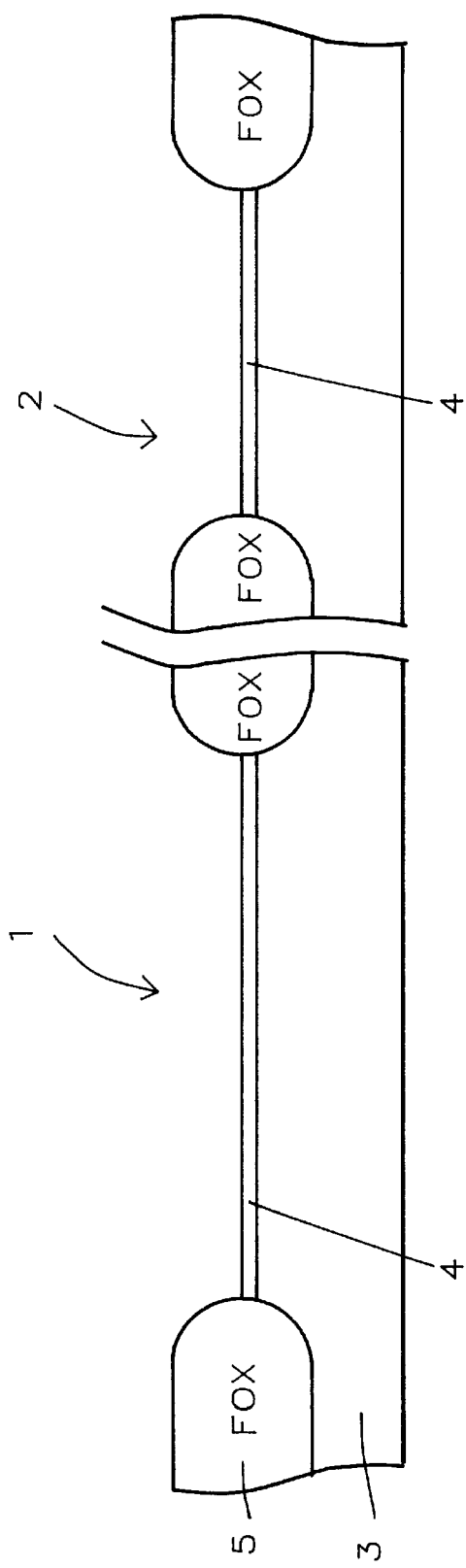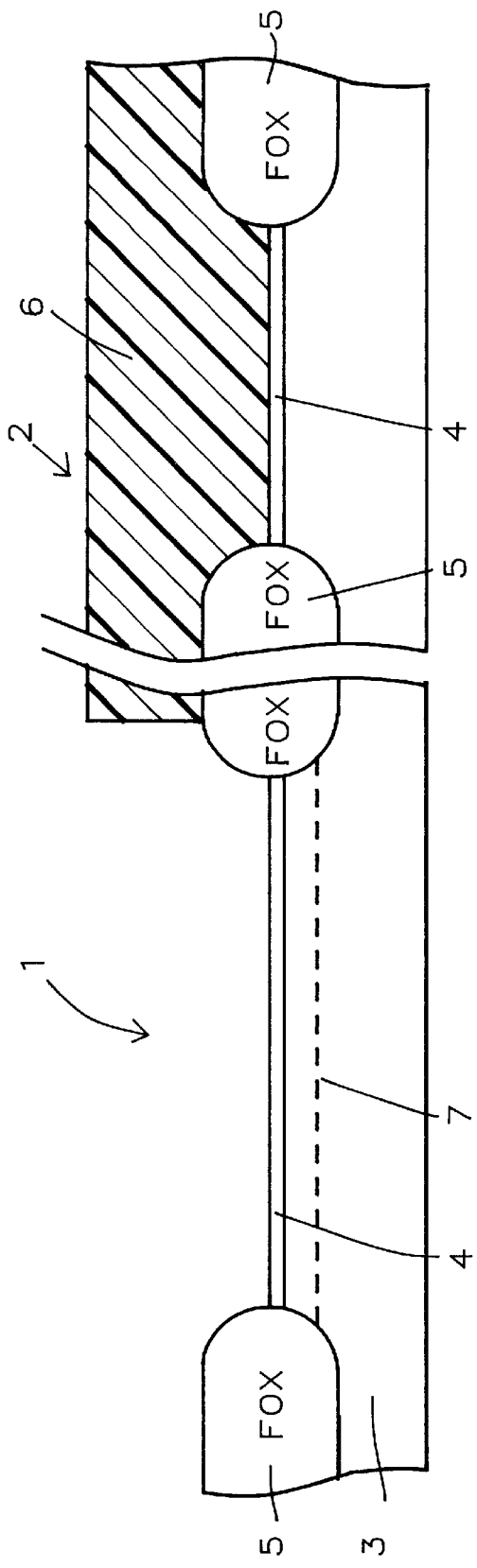

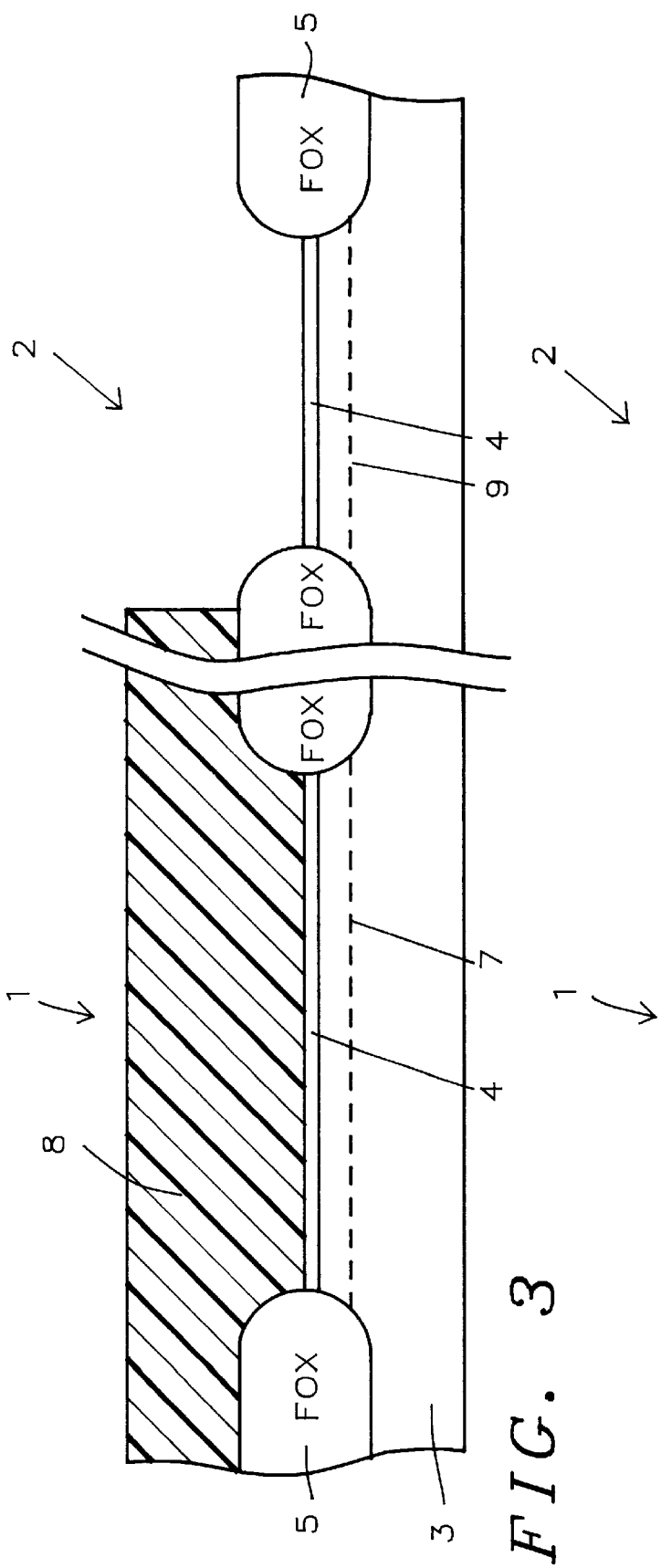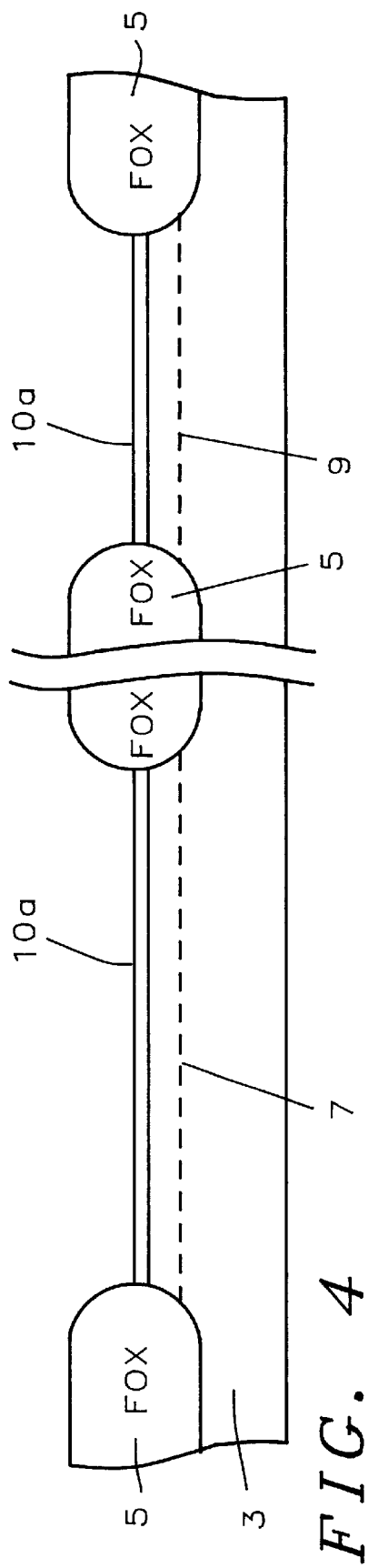

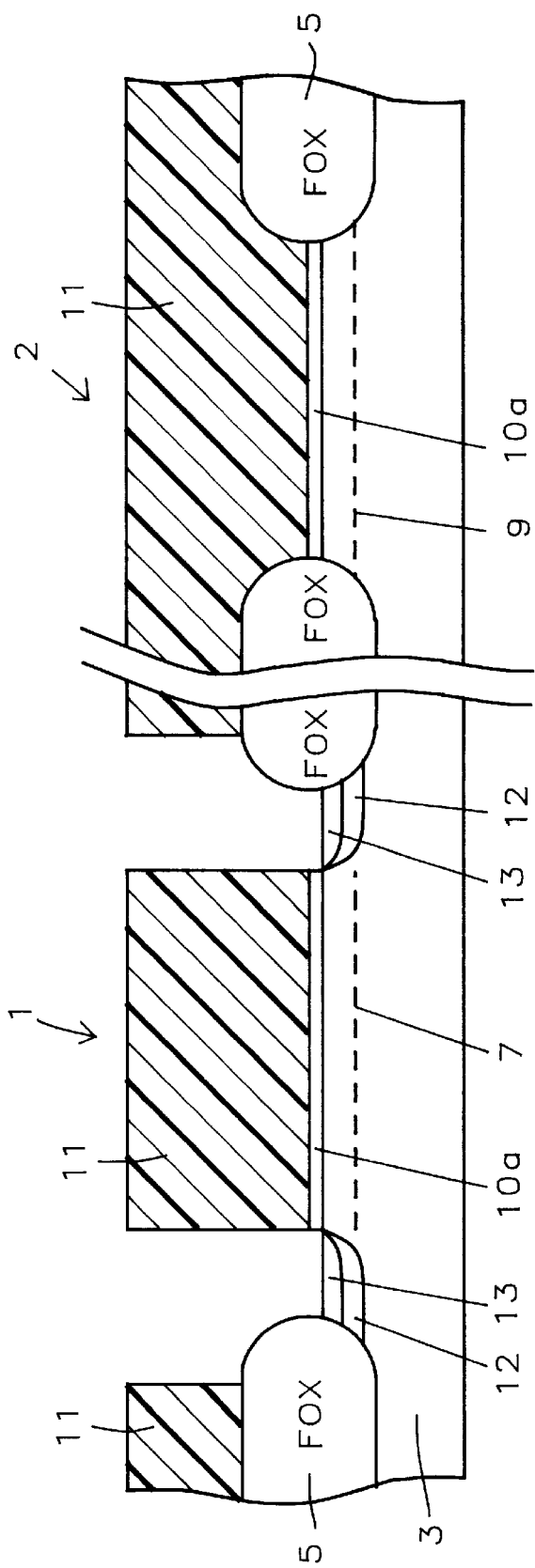
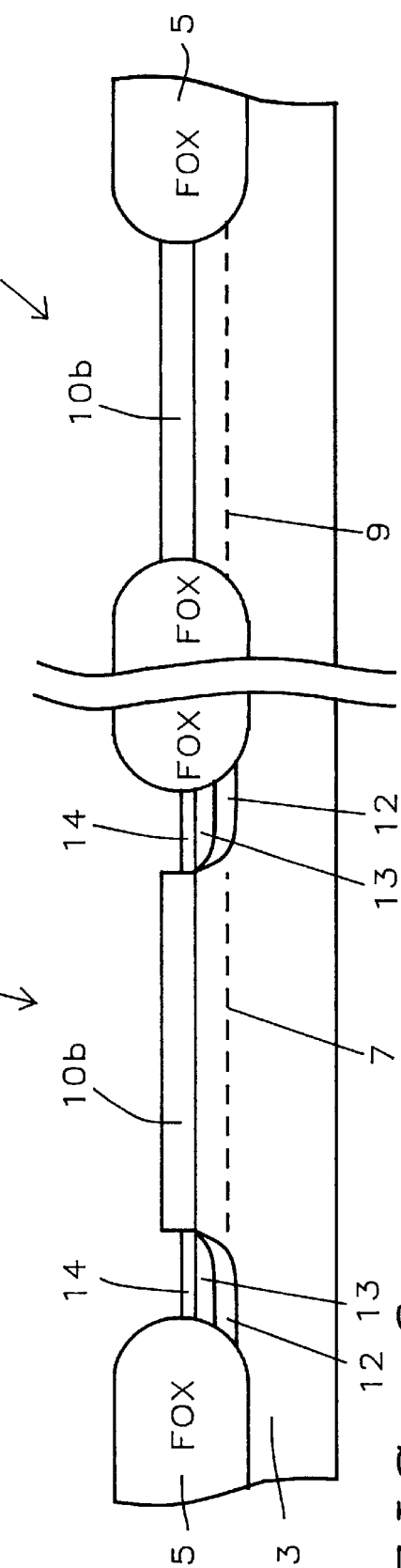
FIG. 5
FIG. 6

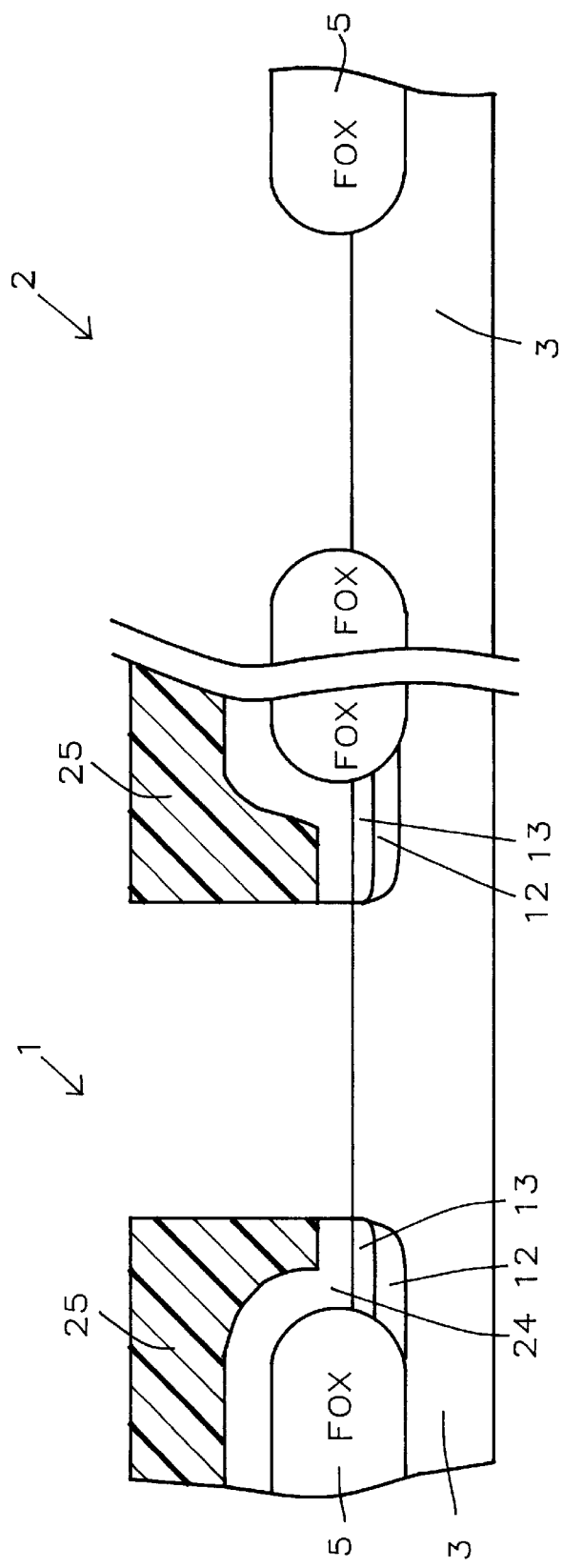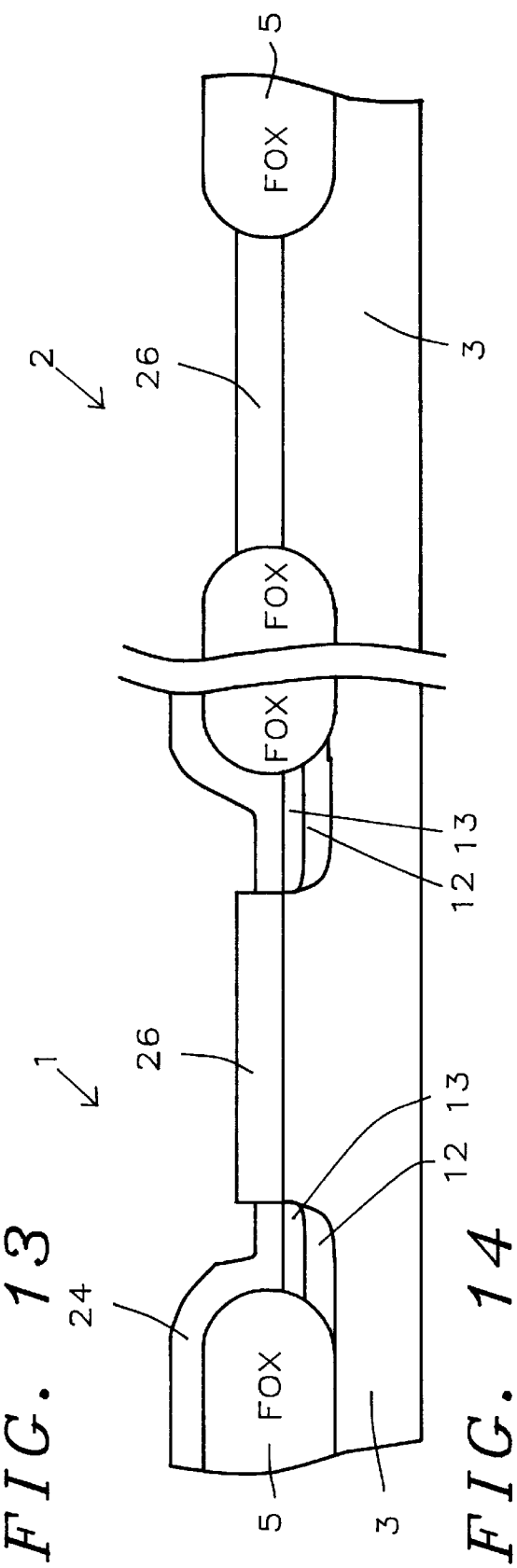

LOGIC AND SINGLE LEVEL POLYSILICON DRAM DEVICES FABRICATED ON THE SAME SEMICONDUCTOR CHIP

This is a division of patent application Ser. No. 08/660,306, filing date Jun. 7, 1996, now U.S. Pat. No. 5,712,201 Fabrication Method For Integrating Logic And Single Level Polysilicon Dram Devices On The Same Semiconductor Chip, assigned to the same assignee as the present invention.

BACKGROUND OF THE INVENTION (1) Field of the Invention

This invention relates to fabrication methods used for semiconductor devices, and more specifically a process used to integrate logic and memory devices on a single semiconductor chip.

(2) Description of Prior Art

Advanced semiconductor chips, now being manufactured in industry, are composed of logic or memory devices. Logic devices are used to process information or data, while memory devices are used for data storage. These two types of devices can be found in almost all computers, however they are usually found on specific chips, reserved for either logic or memory applications. In systems in which logic and memory devices are packaged separately, data signals between the two may have to pass through several levels of packaging, which can result in undesirable propagation delays. In addition the manufacturing costs for fabricating wafers producing only logic chips, and wafers with only memory chips, are greater than if both logic and memory applications can be incorporated on the same chip. Therefore for performance and cost reasons the semiconductor industry has been motivated to produce a semiconductor chip with both the desired logic and memory requirements.

The efforts displayed by the semiconductor industry, in attempting to incorporate both logic and memory requirements on a single semiconductor chip have been increasing. Examples of this have been Takemoto, in U.S. Pat. No. 5,066,602, as well as by Vora, in U.S. Pat. No. 5,340,762. These inventions have addressed incorporating bipolar devices and complimentary metal oxide semiconductor, (CMOS), devices, on a single semiconductor chip. However a process for incorporating dynamic random access memory, (DRAM), devices, with logic devices, basically CMOS technology, using a static random access memory, (SRAM), design, has not been evident. This invention will describe a novel fabrication process that allows the memory DRAM devices to be built simultaneously with logic CMOS devices.

SUMMARY OF THE INVENTION

It is an object of this invention to provide a process for fabricating memory and logic devices on the same silicon chip, or integrated circuit.

It is another object of this invention to fabricate memory devices using a high capacity, (Hi-C) DRAM cell.

It is yet another object of this to use only one layer of polysilicon to fabricate both the DRAM and logic devices.

In accordance with the present invention a fabrication process is described for integrating DRAM and logic devices on the same silicon chip. An N well region is formed only in regions to be used for subsequent P channel, (PFET) cells, for the logic devices, followed by the creation of thick field oxide regions to be used for isolation purposes. A first threshold adjust, ion implantation procedure is performed in areas to be used for subsequent DRAM cells, while a second threshold adjust ion implantation procedure is performed in areas to be used for subsequent N channel, (NFET), cells, for the logic devices. After growth of a gate insulator, a series of boron and arsenic ion implantation are performed, in regions that will subsequently be used as a capacitor, under a storage gate of a DRAM cell. After removal of the gate insulator from the surface of the boron and arsenic implanted silicon, another insulator is regrown, thinner than the gate insulator, that will be used in the storage gate regions. A layer of polysilicon is deposited, doped, and patterned to form polysilicon storage and transfer gates for the DRAM cells, as well as polysilicon gate structures for the logic devices. A lightly doped, N type, source and drain ion implantation is next performed to the NFET cells, of the logic devices, as well as to areas between the storage and transfer gates of the DRAM cells. A lightly doped, P type, source and drain ion implantation is then performed only in the PFET cells, of the logic devices. An insulator layer is next deposited and subjected to an anisotropic reactive ion etching, (RIE), procedure, to create insulator sidewall spacers on the polysilicon storage and transfer gates, for the DRAM cells, and on the polysilicon gate structures, for the logic devices. A heavily doped, N type, source and drain ion implantation is performed to NFET cells, of the logic devices, as well as to a region between polysilicon transfer gates, of the DRAM cells. A heavily doped, P type, ion implantation is then performed only in the PFET cells, of the logic devices. An insulator is next deposited and planarized, followed by contact hole openings to various elements of the NFET and PFET cells, of the logic devices, and to various elements of the DRAM cell. Metallization and patterning to form metal contacts, to various elements of the NFET, PFET and DRAM cells, is then performed.

BRIEF DESCRIPTION OF THE DRAWINGS

The object and other advantages of this invention are best described in the preferred embodiment with reference to the attached drawings that include:

FIGS. 1–12, which schematically, in cross-sectional style, illustrate the stages of fabrication used to construct a high capacity, (HiC), DRAM cell, as well as the NFET cell of a logic device.

FIGS. 13–14, which schematically, in cross-sectional style, illustrates a second embodiment of the HiC DRAM cell, in which a silicon nitride layer is used in the DRAM capacitor.

DESCRIPTION OF THE PREFERRED EMBODIMENTS

Figure 7:
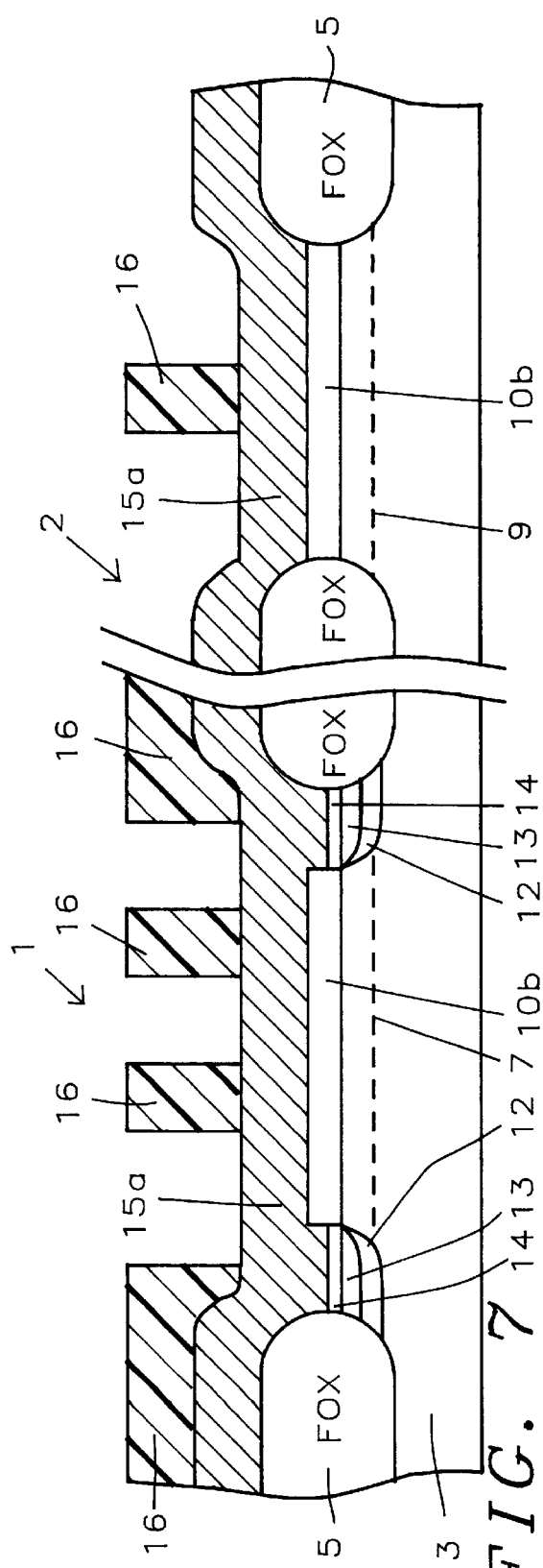

The fabrication process used to integrate HiC DRAM cells and logic cells on a single semiconductor chip will now be covered in detail. FIG. 1, shows an area, 1, to be used for fabrication of the HiC DRAM cell, while an NFET cell, of a logic device, will be fabricated in area, 2. The logic device will also be composed of PFET cells. The process for fabricating the PFET cells, will be covered completely in the description of preferred embodiments, however not shown in the illustrations. A P type, single crystalline silicon substrate, 3, having a <100>crystallographic orientation is used. A layer of silicon dioxide, 4, is thermally grown at a temperature between about 800° to 1000° C., in an oxygen—steam ambient, to a thickness between about 200 to 1000 Angstroms, and used as a screen oxide layer for subsequent ion implantation. An N well region, to be used for a subsequent PFET cell, for the logic device, is next created by photoresist masking the regions to be used for NFET cells, and regions to be used for DRAM cells, followed by an ion implantation of phosphorous, at an energy between about 50 to 200 KeV, at a dose between about 1E12 to 1E14 atoms/cm$^2$. The PFET cell is not shown in FIG. 1. Photoresist removal is performed using plasma oxygen ashing, followed by careful wet cleans. Thick field oxide regions, 5, (FOX), are next formed for purposes of isolation. The FOX regions are formed by depositing a layer of silicon nitride on the underlying silicon dioxide layer, 4, and using conventional photolithographic and RIE procedures to create the desired silicon nitride—silicon dioxide, composite oxidation mask. After photoresist removal using plasma oxygen ashing, followed by careful wet cleans, FOX region, 5, is formed, in areas not covered by the composite oxidation mask, via oxidation in an oxygen—steam ambient, at a temperature between about 850° to 1050° C., to a thickness between about 3000 to 5000 Angstroms. The oxidation masking silicon nitride layer is removed via use of a hot phosphoric acid solution.

The threshold voltage, (Vt), of the DRAM cell, is adjusted via an ion implantation of $BF_2$, 7, at an energy between about 20 to 50 KeV, at a dose between about 1E12 to 5E12 atoms/cm$^2$, which will ultimately result in a Vt for the DRAM cell of between about 0.5 to 0.7 volts. A photoresist mask, 6, is used to protect both the NFET and PFET cells from this ion implantation procedure, shown schematically in FIG. 2. After photoresist removal, via plasma oxygen ashing and careful wet cleans, another photoresist mask, 8, is used to block PFET, as well as the DRAM cells from a another threshold adjust, ion implantation procedure, this time applied to adjust the threshold voltage of the NFET cell. The ion implantation of $BF_2$, 9, shown in FIG. 3, is performed at an energy between about 20 to 50 KeV, at a dose between about 1E12 to 5E12 atoms/cm$^2$, ultimately resulting in an NFET Vt of between about 0.5 to 0. 7 volts. Plasma oxygen ashing, followed by careful wet cleans, are again employed for photoresist removal.

Silicon dioxide layer, 4, used previously as a screen oxide for ion implantation, is next removed using a wet, buffered hydrofluoric acid solution. Another silicon dioxide layer, 10a, to be used as a gate oxide for t he logic devices, and f or the transfer gates of the DRAM cell, i s thermally grown in an oxygen—steam ambient, at a temperature between about 800° to 1000° C., to a thickness between about 40 to 100 Angstroms, and shown schematically in FIG. 4. The formation of the high capacity, (HiC), DRAM cell, is next addressed and shown in FIG. 5. The HiC DRAM approach involves the use of multiple ion implantation, used to increase the substrate doping in the local vicinity of the storage node. Photoresist mask, 11, allows a deep ion implantation of boron, under the subsequent storage plate area, producing P type region 12. The boron is ion implanted at an energy between about 50 to 150 KeV, at a dose between about 1E13 to 5E13 atoms/cm$^2$. However this single ion implantation alone does not increase the charge storage capacity of the cell. Maximum charge storage is obtained by using the same photoresist mask, 11, and ion implanting arsenic, at an energy between about 50 to 150 KeV, at a dose between about 1E14 to 5E14 atoms/cm$^2$, to produce N type region, 13, schematically shown in FIG. 5. Prior to removing photoresist mask, 11, using plasma oxygen ashing, and careful wet cleans, silicon dioxide layer, 10a, is removed from the surface of N type region, 13, via the use of a buffered hydrofluoric acid solution.

Another thermal oxidation is next performed, at a temperature between about 750° to 1000°, in an oxygen—steam ambient, to regrow a silicon dioxide layer, 14, on the surface of N type region, 13. This oxidation also results in a change of thickness for gate oxide layer, 10a, to a thickness of between about 40 to 100 Angstroms, for a modified gate oxide layer, 10b. This is schematically illustrated in FIG. 6. A layer of intrinsic polysilicon, 15a, shown in FIG. 7, is deposited using low pressure chemical vapor deposition, (LPCVD), processing, at temperature between about 500° to 800° C., to a thickness between 2000 to 4000 Angstroms. Polysilicon layer, 15a, is doped using $POCl_3$ procedures, however an alternative of doping the intrinsic polysilicon layer, 15a, via the use of ion implantation procedures, or an alternative of depositing polysilicon layer, 15a, via use of insitu doping, can be used. A photoresist pattern, 16, is used as a mask to allow a RIE procedure, using $Cl_2$ as an etchant, to create polysilicon structures, 15b, to be formed. Polysilicon structures, 15b, will be used for the storage and transfer gate, for the HiC DRAM cells, as well as polysilicon gate structures for the NFET and PFET cells, of the logic devices. This is shown schematically in FIG. 7. Removal of photoresist pattern, 16, is again accomplished via plasma oxygen ashing, followed by careful wet cleans.

Figure 8:
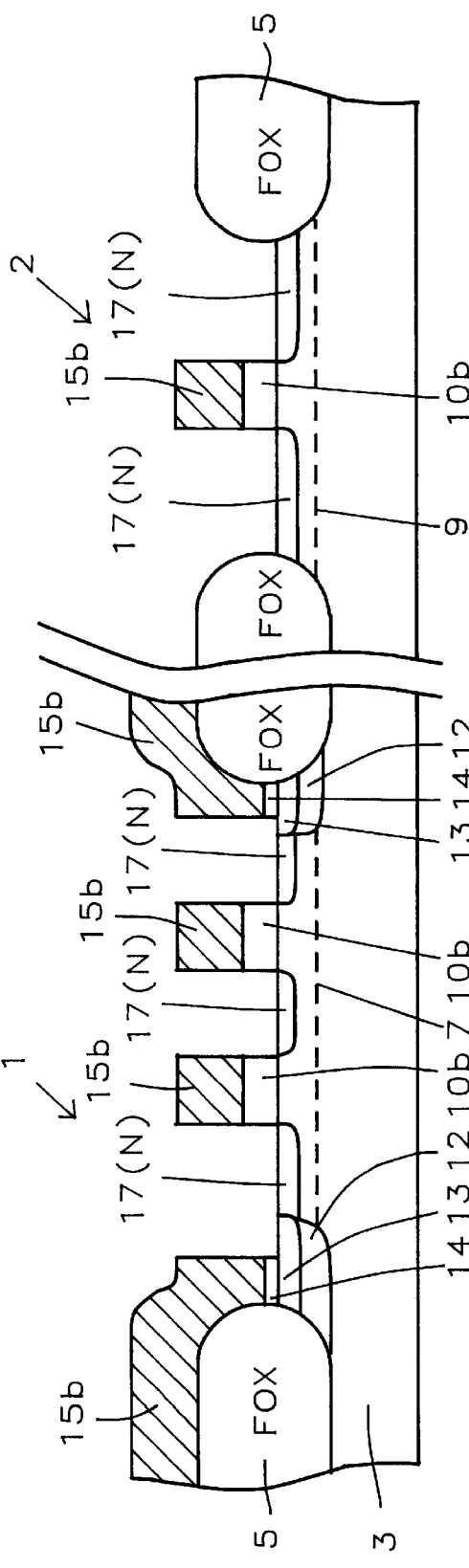
Figure 9:
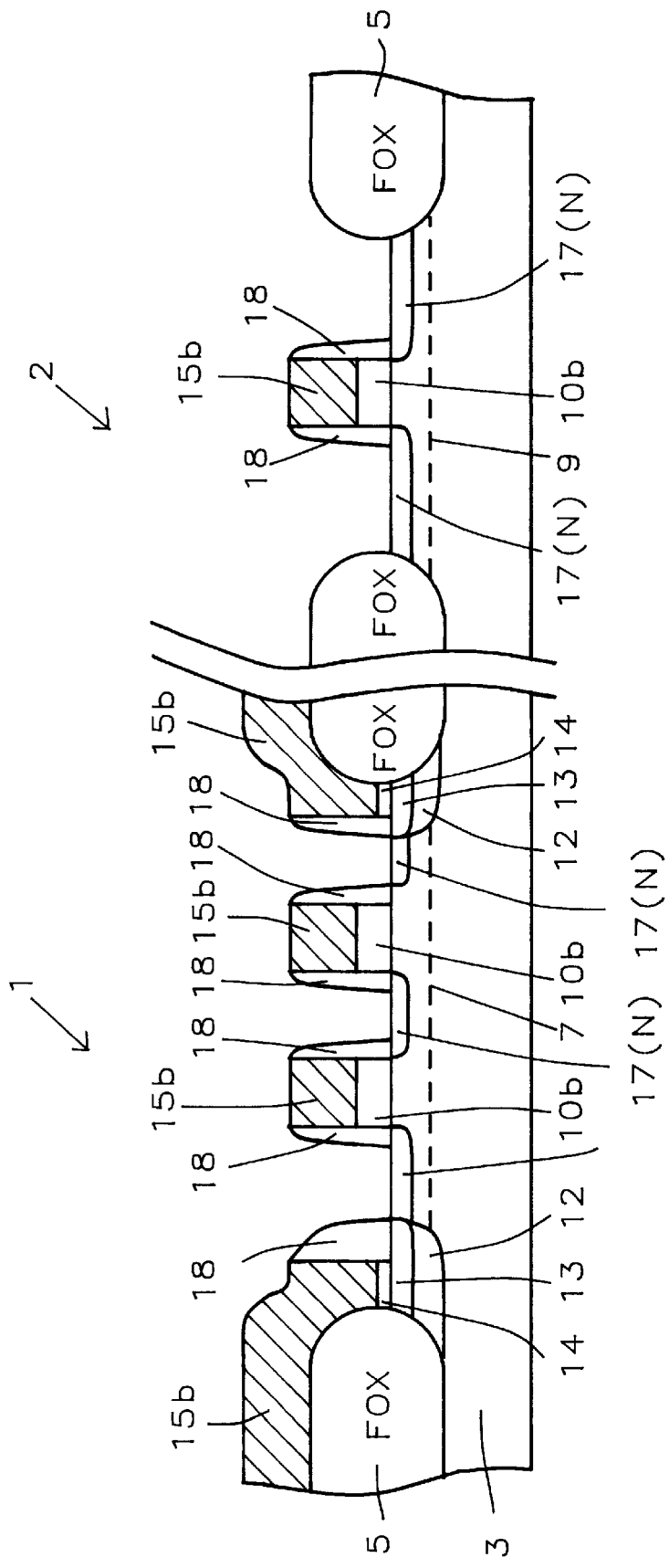
Figure 10:
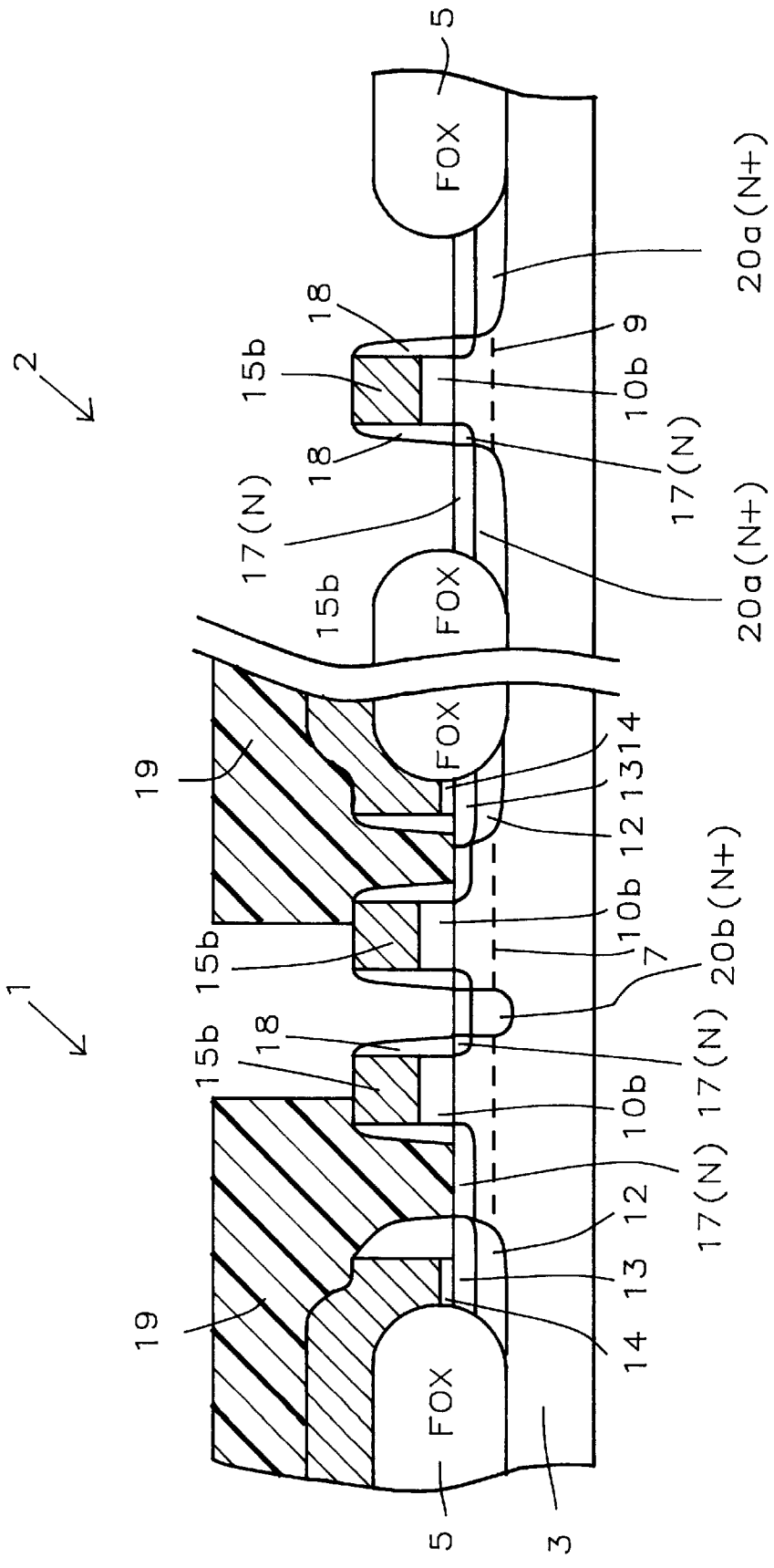

FIG. 8, shows the result of a phosphorous ion implantation procedure, using an energy between about 10 to 70 KeV, at a dose between about 1E13 to 4E13 atoms/cm$^2$, used to produce an N type region, 17. The N type region, 17, is used as the lightly doped source and drain region for the NFET cells, and also to fill the spaces between transfer and storage gates for the HiC DRAM cell. (Not shown in FIG. 8, is a photoresist mask used to prevent the phosphorous ion implantation in the PFET cells, of the logic devices. Also not included in FIG. 8, is a photoresist mask used to allow ion implantation of boron only in PFET regions, to be used for the lightly doped source and drain regions of the PFET cell). A layer of silicon oxide is next deposited, using LPCVD or plasma enhanced chemical vapor deposition, (PECVD), processing, at a temperature between about 400° to 800° C., to a thickness between about 1500 to 4500 Angstroms. Anisotropic, RIE processing, using $CHF_3$ as an etchant, is used to create insulator sidewall spacer, 18, shown in FIG. 9. A photoresist mask, 19, shown in FIG. 10, is next used to allow an ion implantation of arsenic, at an energy between about 20 to 70 KeV, at a dose between about 1E15 to 7E15 atoms/cm$^2$, to create N+, heavily doped regions, 20a, of the NFET cell, of the logic device, while also creating N+ region, 20b, between transfer gates of the HiC DRAM cell. Removal of photoresist mask, 19, is accomplished using plasma oxygen ashing, followed by careful wet cleans. (Not shown in FIG. 10, is the photoresist mask, 19, completely covering a PFET cell, of the logic device, thus avoiding the arsenic ion implantation procedure. Also not shown in FIG. 10, is the boron ion implantation process, used to create the P+, heavily doped, source and drain regions, for the PFET cell, of the logic device. This procedure is performed using a photoresist mask to block both the NFET cell, of the logic device, as well as the HiC DRAM cell, from the boron ion implantation procedure. The photoresist mask is then removed, again via plasma oxygen ashing, and wet clean procedures).

Figure 11:
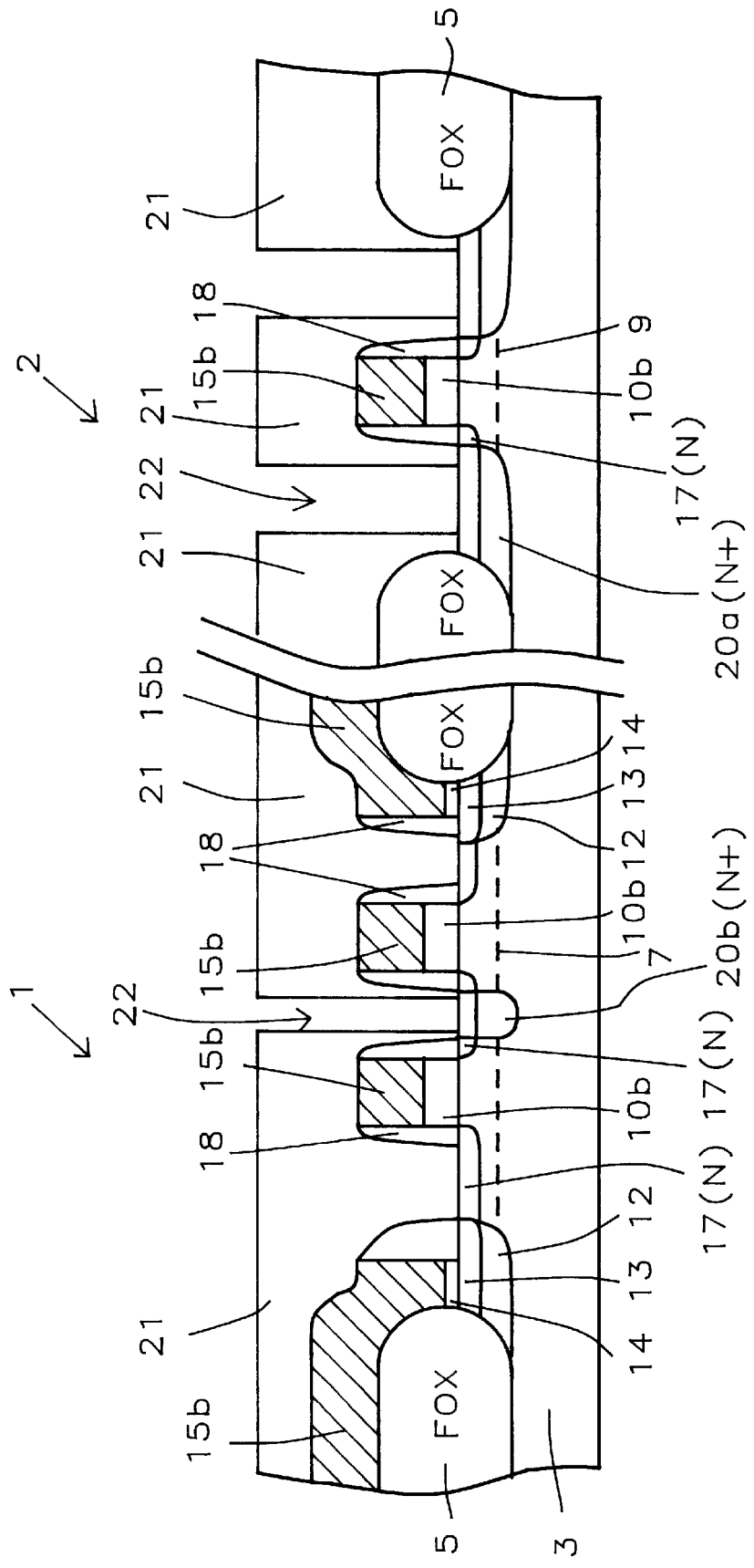
Figure 12:
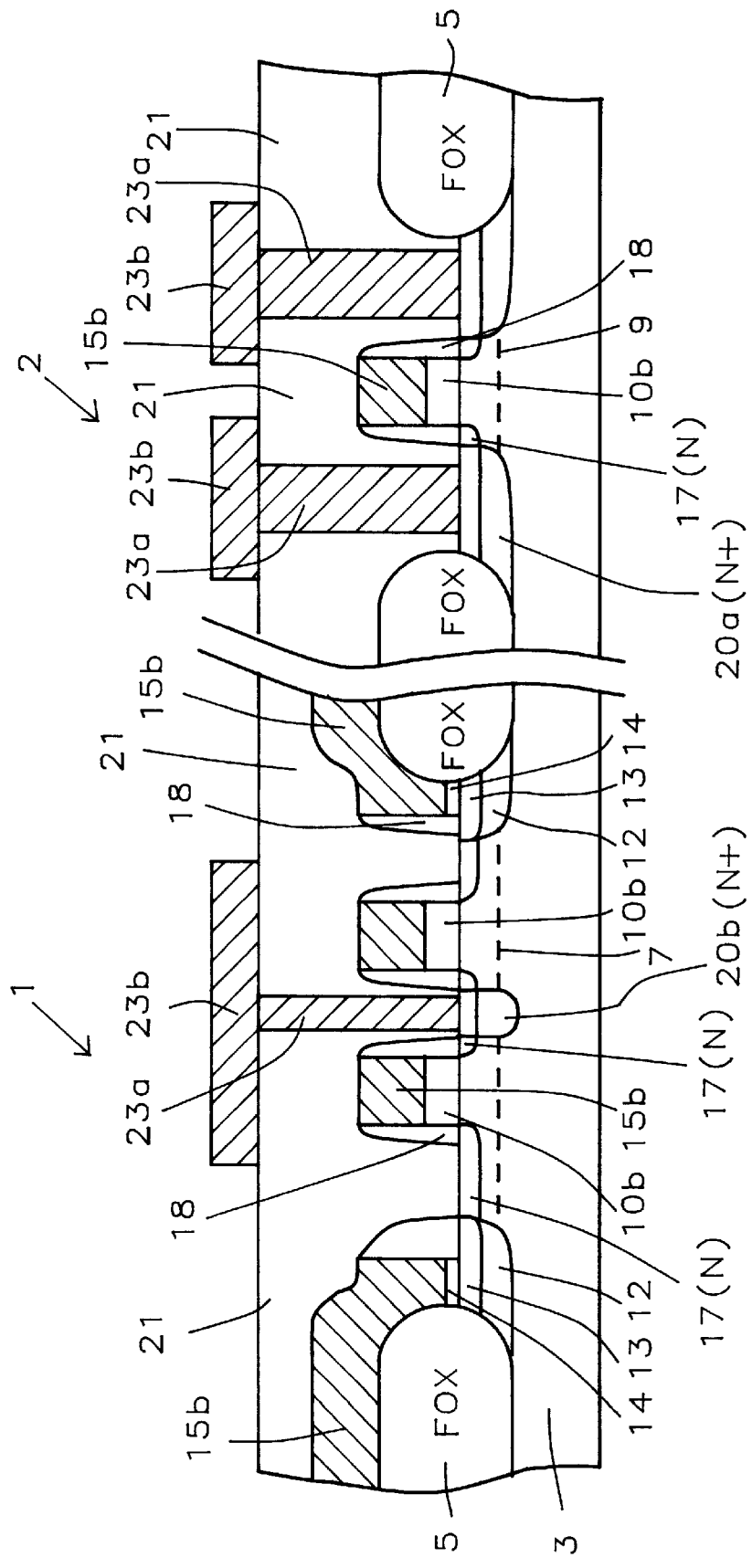

A layer of silicon oxide, 21, is next deposited, using either LPCVD or PECVD processing, at a temperature between about 400° to 800° C., to a thickness between about 8000 to 15000 Angstroms. Chemical mechanical polishing procedures are then employed to planarize silicon oxide layer, 21, producing a smooth topography. Standard photolithographic, and RIE procedures, using $CHF_3$ as an etchant, are used to open contact holes, 22, to N+ source and drain regions, 20a, of the NFET cell, and also to N+ region, 20b, of the HiC DRAM cell. This is shown schematically in FIG. 11. (Contact holes are also opened to regions of a PFET cell, of the logic cell, however not shown in FIG. 11). Photoresist removal is accomplished again using plasma oxygen ashing and careful wet cleans. A LPCVD tungsten deposition, and an $SF_6$, RIE process, is used to create tungsten plug 23a, shown schematically in FIG. 12. A metal layer of aluminum, containing between about 0.5 to 3.0% copper, and between about 0 to 2.0% silicon, is next deposited using r.f sputtering procedures, to a thickness between about 3000 to 6000 Angstroms. Conventional photolithographic and RIE procedures, using $Cl_2$ as an etchant, are used to create metal contact structures, 23b, used for the bit lines contacts of the HiC DRAM cell, and as the metal contacts to the heavily doped source and drain regions of the logic device. Photoresist removal is once again performed using plasma oxygen ashing, followed by careful wet cleans. The result of these process steps is schematically shown in FIG. 12. Subsequent processing, used to form metal contacts to the transfer gates and storage gates of the HiC DRAM cell, as well as to polysilicon gate structures of the logic device, are performed using processes similar to those used to create the bit line metal contacts.

FIGS. 13–14, describe a second embodiment of this invention, using a capacitor insulator of silicon nitride, offering a higher capacitance than silicon oxide counterparts. After formation of P regions, 12, and N regions, 13, produced using processes identical to processes previously described, a layer of silicon nitride, 24, is deposited using LPCVD or PECVD processing, at a temperature between about 700° to 800° C., to a thickness between about 50 to 80 Angstroms. An oxidation procedure, in an oxygen—stream ambient is performed at a temperature between about 50° to 100° C., to convert the surface of silicon nitride layer, 24, to a oxynitride. The oxynitride—nitride layer is then patterned using photoresist mask, 25, with RIE procedures, using $CHF_3$ as an etchant. This is shown in FIG. 13. Photoresist removal is accomplished using plasma oxygen ashing and careful wet cleans. A gate insulator layer, 26, of silicon dioxide, is then grown in areas not covered by layer, 24, at a temperature between about 750° to 950° C., to a thickness between about 50 to 100 Angstroms.

This process for integrating DRAM and logic devices, on a single semiconductor chip, although shown as a HiC DRAM cell, using N channels, can easily be formed using P channels.

While this invention has been particularly shown and described with reference to, the preferred embodiments thereof, it will be understood by those skilled in the art that various changes in form and details may be made without departing from the spirit and scope of this invention.

What is claimed is:

1. A HiC DRAM device structure, and a logic device structure, on a single semiconductor substrate, comprising:
    field oxide regions on the surface of said semiconductor substrate;
    device regions for said HiC DRAM device structure, and for said logic device structure, between said field oxide regions;
    two polysilicon storage gate structures, with insulator spacers on the sides of each polysilicon storage gate structure, and with a first portion of each said polysilicon storage gate structure overlying a said field oxide region, and with a second portion of each said polysilicon storage gate structure overlying adjacent perimeter of said device region, of said HiC DRAM device structure;
    two high capacity memory devices, with each high capacity memory device comprised of a thin capacitor dielectric layer, on a composite doped region in said semiconductor substrate, and with each said composite doped region comprised of an overlying N type region, and an underlying P type region, and with each said high capacity memory device, directly underlying said second portion of a polysilicon storage gate structure, and underlying an insulator spacer, located on the side of said polysilicon storage gate structure;
    two polysilicon transfer gate structures, in center of said device region, of said HiC DRAM device structure, located between said two polysilicon gate structures;
    a heavily doped region in surface of said semiconductor substrate, between said two polysilicon transfer gate structures;
    a polysilicon gate structure in center of said device region, of said logic device structure;
    source and drain regions in surface of said semiconductor substrate, between said polysilicon gate structure and a field oxide region, for said logic device structure; and
    metal contact structures to said heavily doped region, in surface of said semiconductor substrate, between said polysilicon transfer gate structures, of said HiC DRAM device structure, and to said source and drain regions, of said logic device structure.

2. The HiC DRAM device structure of claim 1, wherein said thin capacitor dielectric layer is silicon dioxide, thermally grown in an oxygen—steam ambient, to a thickness between about 40 to 100 Angstroms.

3. The HiC DRAM device structure of claim 1, wherein said thin capacitor dielectric layer is silicon nitride, deposited using chemical vapor deposition processing, to a thickness between about 50 to 80 Angstroms.

* * * * *